United States Patent [19]
Caldwell et al.

[11] 3,932,311
[45] Jan. 13, 1976

[54] ELECTRICALLY CONDUCTING ADHESIVE COMPOSITION

[75] Inventors: John R. Caldwell; James Maynard Hawkins, both of Kingsport, Tenn.

[73] Assignee: Eastman Kodak Company, Rochester, N.Y.

[22] Filed: July 29, 1974

[21] Appl. No.: 492,794

[52] U.S. Cl. ............... 252/514; 156/327; 252/512; 260/42.22; 260/42.54
[51] Int. Cl.² ........................................ H01B 1/02
[58] Field of Search ......... 252/514, 512; 260/42.22, 260/42.54; 156/327

[56] References Cited
UNITED STATES PATENTS

| | | | |
|---|---|---|---|
| 3,140,342 | 7/1964 | Ehrreich et al. | 252/512 X |
| 3,412,043 | 11/1968 | Gilliland | 252/514 |
| 3,514,326 | 5/1970 | Stow | 428/328 |
| 3,609,104 | 9/1971 | Ehrreich et al. | 260/42.22 X |

*Primary Examiner*—Leland A. Sebastian
*Assistant Examiner*—E. Suzanne Parr

[57] ABSTRACT

Electrically conducting adhesive composition comprising crosslinked alkyl acrylate and/or alkyl methacrylate polymer, specially prepared electrically clean silver particles, and a suspending or thickening agent such as silica of large surface area dispersed in a low-boiling solvent system.

8 Claims, No Drawings

ELECTRICALLY CONDUCTING ADHESIVE COMPOSITION

This invention relates to new compositions of matter which are useful as electrically conducting adhesives. These compositions comprise crosslinked alkyl acrylate and/or alkyl methacrylate polymer, specially prepared silver particles, and a suspending or thickening agent dispersed in a low boiling solvent system.

The compositions of this invention are formulated from 35–55 weight percent of a crosslinked polymer prepared via emulsion polymerization techniques from alkyl acrylates and/or alkyl methacrylates, 0.5–5.0 parts of a suspending or thickening agent and 45–65 weight percent of special electrically clean silver particles of 1 to 100 microns prepared by the hydroquinone reduction of silver nitrate in an acidic aqueous solution. The special silver useful in this invention may also be prepared by treating silver particles with a methanol solution of hydroquinone. These components are dispersed in acetone, methyl ethyl ketone, butyl acetate, methylene chloride, similar solvents, or mixtures thereof yielding a thixotropic paste containing 30–50% solids. Highly conductive films having good adhesive and acceptable film properties are obtained from these pastes with solvent evaporation.

An object of this invention is to provide a new and useful electrically conducting adhesive composition.

A further object is to provide a highly conductive adhesive containing low volume percentages of silver.

Another object is to provide an electrically conducting adhesive which is capable of conducting within minutes of application even at room temperature.

A still further object is to provide an electrically conducting adhesive as a thixotropic paste which flows readily under shear and stress forces, but which remains in place after application.

The electrically conducting, solvent based adhesive formulations of this invention have several unique features. The polymeric matrix of this adhesive is a crosslinked alkyl acrylate and/or alkyl methacrylate polymer having a glass transition temperature below 30°C. The crosslinked polymers may contain up to about 50% of another monomer such as vinyl acetate, styrene, a fumarate ester, a maleate ester, vinylidene chloride, a vinyl ether, an amide of acrylic or methacrylic acid, and the like. These polymers are prepared by standard emulsion polymerization procedures using up to about 3% of a crosslinking monomer such as ethylene diacrylate, ethylene dimethacrylate, triethylene glycol diacrylate, or divinylbenzene. Such procedures are described by Wayne R. Sorenson and Tod W. Campbell, Preparative Methods of Polymer Chemistry, Interscience Publishers, Inc., New York, 1961, pp. 162–163. At the completion of the polymerization, a discreet, crosslinked, emulsified polymer exists. This polymer is isolated in the usual manners such as coagulation with salt or spray drying. These minute, crosslinked polymer particles can then be redispersed in the solvent system by shaking, stirring in a Waring blender or Sigma mixer, or ball milling. This dispersion has the appearance of a viscous solution.

Because these polymers are crosslinked, they occupy an exclusive volume in the solvent system and in the resultant adhesive film. This tightly bound polymer restricts the special silver particles to areas outside the polymeric sphere. This exclusion of the silver into the interstices forces the silver to be in contact with adjacent particles to thus give pathways for the flow of current at much lower volume percentages of silver particles than would be predicted by the statistical distribution of silver particles in a polymeric solution. Bonds having resistivities of $<1\Omega/cm/mm^2$ are obtained with 8–15 volume percent silver in these adhesives.

The special electrically clean silver particles employed in this invention are preferably prepared by the hydroquinone reduction of silver nitrate. The process involves the reduction of silver nitrate to prepare crystalline silver particles ranging in size from about 10–100 microns, the silver particles being characterized by electrically clean surfaces, and comprises (a) preparing an aqueous solution of silver nitrate, the concentration of said silver nitrate being in the range of about 0.25–1.0 mole per liter of water; (b) adding nitric acid in the ratio of about 0.1 to 3.0 ml. per liter of said aqueous solution; (c) preparing an aqueous solution of reducing agent characterized by a redox potential of 0.649 to 0.779 Volts, solubility of at least about 0.25 mole per liter at 25°C., and being present in the ratio to silver nitrate of 1 to 1.25 molar equivalents dissolved in about 0.5 to 2 liters of water; (d) blending said aqueous solution of reducing agent and said aqueous solution of silver nitrate to thereby reduce said silver nitrate in a redox reaction, said reaction being conducted at a temperature of about 0°–50°C. for about 2 to 24 hours; (e) filtering and washing said silver particles until the filtrate is essentially clear; and (f) drying said silver particles.

Electrically clean silver particles also useful in the invention may also be prepared by treating commercial silver particles of 1 to 2 microns at 0° to 50°C. for at least 2 minutes with a 2% methanol solution of hydroquinone after which the particles are washed with water and dryed. Also commercial silver particles may be prepared by treating with sodium sulfite by working three times for about four minutes each with equal amounts of 2% aqueous sulfite as described later herein.

A highly conductive, useful adhesive can be obtained by blending the crosslinked particulate polymer, the silver powder and the solvent. However, in such a composition, the silver tends to settle out during storage. It has been found that the separation or settling of the silver particles can be prevented by the addition of a suspending or thickening agent. In general, these are inorganic particulate materials that have an active surface and a particle size less than about 2 microns. In most cases, they impart thixotropic properties to the suspension and promote the formation of smooth, even coatings. These suspending agents are well known in the paint industry.

Typical examples of useful suspending agents include the following:

| Chemical Composition | Trade Name | Manufacturer |
|---|---|---|
| Calcium silicate | Silene EF | Pittsburgh Plate Glass |
| Calcium silicate | Hi-Sil C | Pittsburgh Plate Glass |
| Calcium carbonate | Multiflex MM | Diamond Shamrock |
| Sodium silica aluminate | Zeolex 7 | Huber Corp. |
| $SiO_2$ | Cabosil | Cabot Corp. |

A preferred suspending agent is very fine, nonporous, amorphous silica of large surface area provides the mechanism for making the formulation a thixotropic paste. Silica that is particularly useful in this invention is characterized by a surface area of 200 ± 25 $m^2$/gm., a density of 2.3–6 pounds/ft.$^3$, a pH of 3.5–4.2 and a nominal particle size of 0.014 microns. The silica has the ability to develop a loosely-woven lattice-like network by hydrogen bonding with itself. The resultant network raises the apparent viscosity of the formulation and contributes to the suspension of the silver powder. This gives a stable paste when the formulation is at rest. However, the hydrogen bonds that hold the formulation together at rest are easily broken under shear and stress forces, thus giving a formulation that will readily flow during application. When the forces are removed, the hydrogen bonding quickly reforms giving a stable paste.

Other useful types of suspending agents include fine clays, aluminum oxide and organophilic bentonites as described in J. Phys. Coll. Chem. 53 294 (1949). The amount of suspending agent used will depend upon the flow properties desired but in general from about 0.5% to 5% by weight is employed, based upon the total composition.

The solvents useful in this invention are characterized by boiling points in the range of 40°–140°C., solubility parameters in the range of 8.3–10.3, and are capable of weak to moderate hydrogen bonding and include acetone, methyl ethyl ketone, diethyl ketone, methyl butyl ketone, methyl isobutyl ketone, methylene chloride, trichloroethane, trichloroethylene, chloroform, methyl acetate, methyl formate, ethyl acetate, butyl acetate, n-butyl acetate isobutyl acetate, benzene, toluene, chlorobenzene, similar low boiling solvents, and mixtures thereof. The solvents are adjusted to give the best film formation with the crosslinked polymer and to give the fastest drying time. Solvents do evaporate faster from this system than a comparable system containing a soluble polymer because the crosslinked polymer releases the solvent faster. This is due to the exclusion of the solvent to the surface of the dispersed, crosslinked polymer. The solvent comprises 50–70 weight percent of the formulation.

The adhesive compositions are formulated by dispersing the crosslinked polymer in the solvent system with stirring, shaking or ball milling. The special silver particles are then added with additional mixing followed by the suspending agent. This mixture is stirred or ball milled until it is well mixed and the consistency of a paste.

These adhesive formulations rapidly give highly conductive bonds, beads, and films. They are useful as substitutes for soldering where soldering is inconvenient, unavailable, or might damage delicate parts. These bonds, beads, and films have low resistivities and are capable of carrying high and low currents with low voltage drops and no heat buildup.

This invention will be further illustrated by the following examples although it will be understood that these examples are included merely for purposes of illustration and are not intended to limit the scope of the invention.

EXAMPLE 1

A 3 liter, three-necked, round-bottomed flask is equipped with a thermometer, a mechanical stirrer, and inlet ports from a Polystaltic pump which drains two reservoirs. One mole of silver nitrate dissolved in 1 liter of water and 2 ml. of nitric acid are added to the flask and cooled to approximately 20°C. One liter of water containing 0.62 moles of hydroquinone is placed in one reservoir and 500 ml. of water containing 1 mole of sodium acetate is placed in the outer reservoir. The mechanical stirrer agitates the solution at approximately 75 rpm. The addition of the hydroquinone solution is initiated and fed at such a rate as to complete addition in 30 minutes. Fifteen minutes after beginning the addition of the hydroquinone solution, the addition of sodium acetate solution is begun. It is also added at such a rate as to complete addition in 30 minutes. The reduction is allowed to proceed for 4 hours from the start of the hydroquinone addition. At this time, the crystalline silver particles are filtered and washed with water until the filtrate is clear. This requires about 10 liters of water. The silver particles are dried in a vacuum oven at 50°C. This yields high quality electrically clean silver particles suitable for use in electrically conducting adhesive in 94.2% yield.

EXAMPLE 2

The same equipment set-up as described in Example 1 is used. One mole of silver nitrate in 1 liter of water is added to the flask and maintained at 20°C. One drop of nitric acid is added. One mole of ferrous sulfate dissolved in 1 liter of water is placed in the reservoir and one drop of sulfuric acid is added. The ferrous sulfate solution is pumped into the flask over a 1-hour period. The reduction is allowed to proceed for 4 hours. The silver metal particles are filtered, washed with 10 liter of water, and dried 24 hours in a vacuum oven at 50°C. Crystalline silver particles are obtained in 76.7% yield. These electrically clean silver particles are suitable for use in electrically conducting adhesives.

EXAMPLE 3

A polymer is prepared via an emulsion polymerization technique using a redox catalyst system. A mixture is prepared of 80 g. methyl acrylate; 20 g. of methylmethacrylate; 2 g. of ethylene diacrylate; 1 g. of potassium persulfate; 0.5 g. of sodium bisulfite; 2 g. of sodium dodecylbenzene sulfonate and 900 g. of water and agitated at 60°C. for 10 hours to produce a stable emulsion polymer. The polymer is isolated, washed free of surfactants and other impurities, and dried. Thirty parts by weight of the finely-divided polymer are dispersed in a mixture of 50 parts acetone/50 parts butyl acetate by mechanically stirring at room temperature. When a smooth dispersion is obtained, 50 parts by weight of electrically clean silver particles made by the procedure of Example 1 are added. After stirring briefly, 1 part of an amorphous fumed silica characterized by a surface area of 200 ± 25 $m^2$/gm., density of 2.3–6 pounds/ft.$^3$, a pH of 3.5–4.2, and a nominal particle size of 0.014 is added and stirring is continued until the mixture is smooth and homogeneous. The resulting thixotropic paste gives a fast drying, electrically conducting bead having a resistance of $<1\Omega/cm/mm^2$. Similar results are obtained by using calcium silicate or calcium carbonate as the suspending agent.

EXAMPLE 4

Poly(methyl acrylate) crosslinked with 3% ethylene diacrylate is prepared via an emulsion polymerization technique, similar to that described in Example 1, and isolated. Thirty parts by weight of the polymer are dispersed in 100 parts of acetone by ball milling at room temperature. Fifty parts by weight of silver particles prepared by the procedure of Example 1 and one part by weight of silica (as in Example 3) are also mixed in to give a smooth, homogeneous thixotropic paste. This paste gives a conductive bond between two copper wires which has a resistance of <1.0Ω/cm/mm². Similar results are obtained by using aluminum oxide, sodium silico aluminate or an organophilic bentonite as the suspending agent.

EXAMPLE 5

Thirty grams of Silflake 135, a commercial silver powder sold by Handy & Harman Co., was washed for 2 minutes four times with equal amounts of a total of 300 ml. of methanol containing 2 weight percent hydroquinone. The washed Silflake powder was dried 20 hours at 50°C. under vacuum.

The following electrically conducting adhesive was prepared using this silver:
- 30 parts - An 80/20/2 terpolymer of methyl acrylate/methyl methacrylate/ethylene diacrylate prepared via conventional emulsion polymerization techniques
- 50 parts - Washed electrically clean silver particles from above
- 1 part - Cab-0-Sil M-5 silica
- 50 parts - Acetone
- 50 parts - Methyl ethyl ketone This smooth, homogeneous, thixotropic paste gave a fast drying, electrically conducting bead having a resistance of 2.0Ω/cm/mm².

EXAMPLE 6

Fifteen grams of Silflake 135 silver powder was washed for 4 minutes three times with equal amounts of a total of 150-ml. of 2% aqueous sodium sulfite. The washed Silflake silver particles were dried 20 hours at 50°C. under vacuum.

An electrically conducting adhesive was formulated as shown in Example 3 above using this electrically clean silver powder. The resultant smooth, homogeneous, thixotropic paste gave a fast drying, electrically conducting bead having a resistance of <3.0Ω/cm/mm².

EXAMPLE 7

Fifteen grams of Silflake 135 silver powder was washed for 1 minute four times with equal amounts of a total of 250-ml. of 10% aqueous nitric acid. The washed Silflake silver powder was dried 20 hours at 50°C. under vacuum.

An electrically conducting adhesive was formulated as shown in Example 3 above using this electrically clean silver powder. The resultant smooth, homogeneous, thixotropic paste gave a fast drying, electrically conducting bead having a resistance of <5.0Ω/cm/mm².

EXAMPLE 8

A polymer is prepared from 60 parts methyl acrylate, 37 parts vinyl acetate and 3 parts butylene dimethacrylate by a conventional emulsion method. It is used in place of the polymer as described in Example 3 to give a conducting adhesive having a resistance of less than 4.052/cm/mm².

EXAMPLE 9 - Comparative Example

Silflake 135 silver powder is treated by stirring the silver powder in a solution of 2%, based on the weight of the solution, hydroquinone dissolved in methanol. After 2 minutes the silver powder is collected by filtration. After drying, the powder is found to have very low electrical contact resistance as shown by the following comparative data. A volume of unpacked powder having the dimensions 0.107 × 0.107 × 3.3 mm. is measured for resistance along the 3.3 mm length using an Ohm meter having an input impedance of 10⁹ ohms. The measurements are made also for untreated Silflake 135 powder and Silflake 135 powder washed with methanol in the same manner as the Silflake washed with methanol containing 2% hydroquinone. The results of the measurements are as follows.

| | |
|---|---|
| Untreated Silflake 135 | $R = >5 \times 10^8$ ohms |
| Silflake 135 washed with methanol | $R = >5 \times 10^8$ ohms |
| Silflake 135 washed with methanol containing 2% hydroquinone | $R = 0.8$ ohms |

EXAMPLE 10 - Comparative Example

Thirty parts of polyethylene and 70 parts of the specially prepared electrically clean silver (prepared as in Example 1) are blended and compression molded into a bar. The resistance of the bar is >10⁶Ω/cm/mm². When a bar is prepared in the same manner from cellulose acetate butyrate, the resistance is also >10⁶Ω/cm/mm².

EXAMPLE 11 - Comparative Example

Seventy parts of electrically clean silver particles prepared according to Example 1 are mixed into tung oil, a drying oil, and cobalt naphthanate is added to catalyze the crosslinking of the tung oil into a film. The dried film has a resistance of >10⁶Ω/cm/mm².

EXAMPLE 12 - Comparative Example

Thirty parts of an 80/20/2 methyl acrylate/methyl methacrylate/ethylene diacrylate polymer prepared by conventional emulsion polymerization techniques are dispersed in 100 parts of acetone by stirring at room temperature. Sixty-five parts of Silflake 135 silver powder, which has not been cleaned, followed by 1 part of silica (as in Example 3) are added and stirred to give a smooth paste. The resulting thixotropic paste gives a fast drying film having a resistance of >10⁶Ω/cm/mm². When cooper metal is substituted for the Silflake 135 silver powder in this example, similar results are obtained.

Although the invention has been described in considerable detail with particular reference to certain preferred embodiments thereof, variations and modifications can be effected within the spirit and scope of the invention.

We claim:
1. Adhesive composition comprising
   a. crosslinked polymer particles having a glass transition temperature below about 30°C. selected from polymers of alkyl acrylate, alkyl methacrylate, copolymers of alkyl acrylate and alkyl methacrylate and mixtures thereof, said crosslinked polymer particles being present in the amount of about 35–55 weight percent;
   b. electrically clean silver particles of 1 to 100 microns in the amount of 45–65 weight percent;

c. a suspending agent in the amount of 0.5 to 5.0 weight percent, said suspending agent being a particulate, insoluble inorganic compound having a particle size less than about 2 microns;

d. an organic solvent selected from acetone, methyl ethyl ketone, diethyl ketone, methyl butyl ketone, methyl isobutyl ketone, methylene chloride, trichloroethane, trichloroethylene, chloroform, methyl acetate, methyl formate, ethyl acetate, n-butyl acetate isobutyl acetate, benzene, toluene, chlorobenzene and mixtures thereof, and e. said polymer particles, electrically clean silver powder, and suspending agent being disposed in said organic solvent in the amount of about 30 to 50 percent solids.

2. Adhesive composition of claim 1 wherein said crosslinked polymer particles comprises polymers containing up to about 50% of another unsaturated polymerizable compound.

3. Adhesive composition of claim 1, wherein said suspending agent is a non-porous, amorphous silica present in the amount of 0.5 to 5.0 weight percent, said silica being characterized by a surface area of $200 \pm 25$ m$^2$/gm., density of 2.3–6 pounds/ft.$^3$, a pH of 3.5–4.2 and a nominal particle size of 0.014 microns.

4. Adhesive composition of claim 1 wherein said crosslinked polymer particles are crosslinked with a crosslinking monomer selected from ethylene diacrylate, ethylene dimethacrylate, triethylene glycol diacrylate, divinylbenzene and butylene dimethacrylate.

5. Adhesive composition of claim 1 wherein said polymer particles comprise a terpolymer of methyl acrylate, methyl methacrylate and diethylene diacrylate, said polymer particles being present in the amount of about 37 weight percent.

6. Adhesive composition of claim 5 wherein said electrically clean silver particles are present in the amount of about 62 weight percent.

7. Adhesive composition of claim 6 wherein said suspending agent is present in the amount of 1 weight percent.

8. Adhesive composition of claim 7 wherein said solvent system is 50/50 acetone/methyl ethyl ketone.

* * * * *